United States Patent
Liu et al.

(10) Patent No.: US 7,123,267 B2
(45) Date of Patent: Oct. 17, 2006

(54) CORE LOGIC CHIP CONDUCTING MULTI-CHANNEL DATA TRANSMISSION

(75) Inventors: Chih-Yuan Liu, Taipei (TW); Chi-Hsin Lin, Taipei (TW); Mei-Ling Lin, Taipei (TW); Chia-Hsing Yu, Taipei (TW)

(73) Assignee: Via Technologies, Inc., Shindian (TW)

( * ) Notice: Subject to any disclaimer, the term of this patent is extended or adjusted under 35 U.S.C. 154(b) by 354 days.

(21) Appl. No.: 10/629,246

(22) Filed: Jul. 29, 2003

(65) Prior Publication Data
US 2004/0057298 A1 Mar. 25, 2004

(30) Foreign Application Priority Data
Sep. 25, 2002 (TW) ................ 91122041 A

(51) Int. Cl.
*G06F 13/14* (2006.01)
*G06F 15/167* (2006.01)

(52) U.S. Cl. ............... 345/519; 345/532; 345/542

(58) Field of Classification Search ........... 345/542, 345/519, 520, 541, 531, 532; 710/100, 126–129
See application file for complete search history.

(56) References Cited

U.S. PATENT DOCUMENTS 6,232,990 B1   5/2001  Poirion
6,480,198 B1 * 11/2002  Kang ................. 345/519

* cited by examiner

Primary Examiner—Dennis-Doon Chow

(57) ABSTRACT

An additional data transmission channel is provided between the north bridge chip and the system memory when the graphic accelerator is integrated into the north bridge chip. The additional data transmission channel can be similar to the existent data transmission channel between the north bridge chip and the system memory for providing extensive data transmission bandwidth. Alternatively, the additional data transmission channel can be specific to the communication between the graphic accelerator in the north bridge chip and the frame buffer in the system memory.

4 Claims, 4 Drawing Sheets

CORE LOGIC CHIP CONDUCTING MULTI-CHANNEL DATA TRANSMISSION

FIELD OF THE INVENTION

The present invention relates to a core logic chip, and more particularly to a core logic chip conducting multi-channel data transmission.

BACKGROUND OF THE INVENTION

Please refer to FIGS. 1A and 1B that are schematic diagrams showing conventional personal computer structures. The core circuit of each of the computer structures comprises a microprocessor 10, a north bridge chip 11 and a south bridge chip 12. A system memory 13 communicates with the north bridge chip 11 via a memory bus. In FIG. 1A, a graphics chip separate from the north bridge chip is shown. The graphics chip is incorporated in a graphics card 14. The graphics card 14 is connected to the north bridge chip 11 via a PCI (Peripheral Component Interconnect) or AGP (Accelerated Graphics Port) bus, and comprises a graphics accelerator 141 and a local memory 142 specifically connected to and provided for the graphics accelerator 141. Alternatively, in the computer structure of FIG. 1B, the graphics accelerator 141 is integrated into the north bridge chip 11. Therefore, the local memory 142 is not present any longer, and in stead, a specified memory block 131 is defined in the system memory 13, which is referred to as an AGP memory, to perform the function of the local memory 142. The graphics accelerator 141 thus shares the memory bus between the north bridge chip 11 and the system memory 13 to communicate with the AGP memory 131.

The memory bus between the system memory 13 and the north bridge chip 11 is generally uni-channel structured, and has a data bandwidth of 64 bits. Such data transmission bandwidth, however, has been beyond practical requirement due to the significantly increasing data transmission quantity between the system memory 13 and the north bridge chip 11. The situation is even serious on the condition that the data transmission bandwidth of the memory bus has to be shared by the graphics accelerator 141 for accessing the AGP memory 131.

SUMMARY OF THE INVENTION

Therefore, an objective of the present invention is to provide a core logic chip conducting multi-channel data transmission to solve the above problems.

A first aspect of the present invention relates to a core logic chip for use in a personal computer system. The personal computer system comprises a system memory and a display. The core logic chip is incorporated therein: a primary memory control circuit asserting a first read/write signal; a first data transmission channel in communication with the primary memory control circuit and a first portion of the system memory, transmitting the first read/write signal to the first portion of the system memory; a graphics accelerator in communication with the display, processing and outputting image data to the display; a backup memory control circuit in communication with the graphics accelerator, controlled by the graphics accelerator to assert a second read/write signal; and a second data transmission channel in communication with the backup memory control circuit and a second portion of the system memory, transmitting the second read/write signal to the second portion of the system memory.

Preferably, the second portion of the system memory includes a frame buffer.

Preferably, the system memory is a dynamic random access memory.

Preferably, the first and second data transmission channels are separate from each other and operated independently.

A core logic chip for use in a personal computer system comprising a system memory and a display, is incorporated therein: graphics accelerator in communication with the display, processing and outputting image data to the display; a primary memory control circuit in communication with the graphics accelerator, controlled by the graphics accelerator to assert a first read/write signal; a first data transmission channel in communication with the primary memory control circuit and the system memory, transmitting the first read/write signal to the system memory; a backup memory control circuit in communication with the graphics accelerator, controlled by the graphics accelerator to assert a second read/write signal; and a second data transmission channel in communication with the backup memory control circuit and the system memory, transmitting the second read/write signal to the system memory. Each of the first and the second read/write signals is a part of a specific read/write signal.

Preferably, the first and second data transmission channels are separate from each other but cooperating to transmit the specific read/write signal.

BRIEF DESCRIPTION OF DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1A:
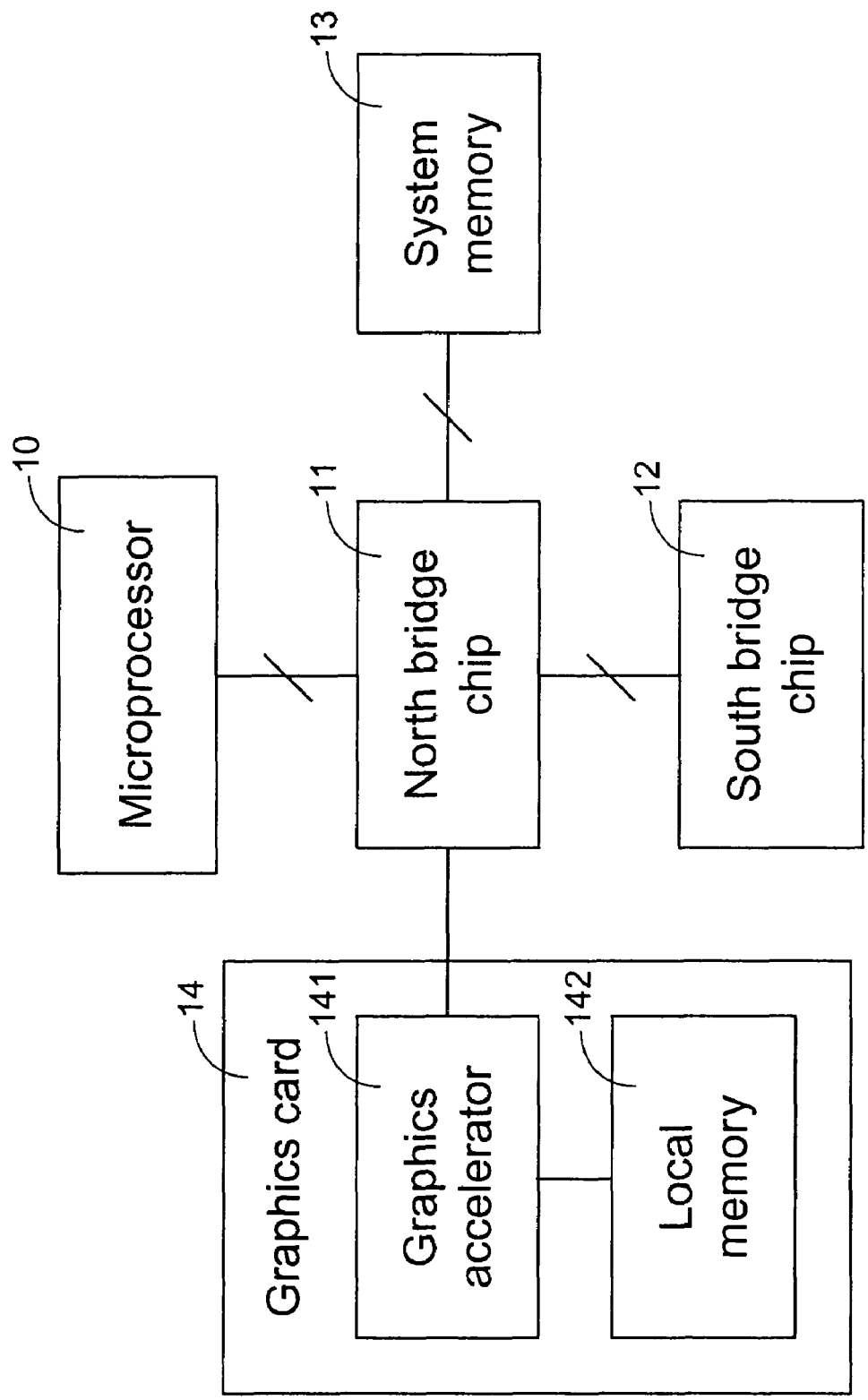
FIGS. 1A and 1B are schematic diagrams showing conventional personal computer structures associated with graphics functions.
Figure 1B:
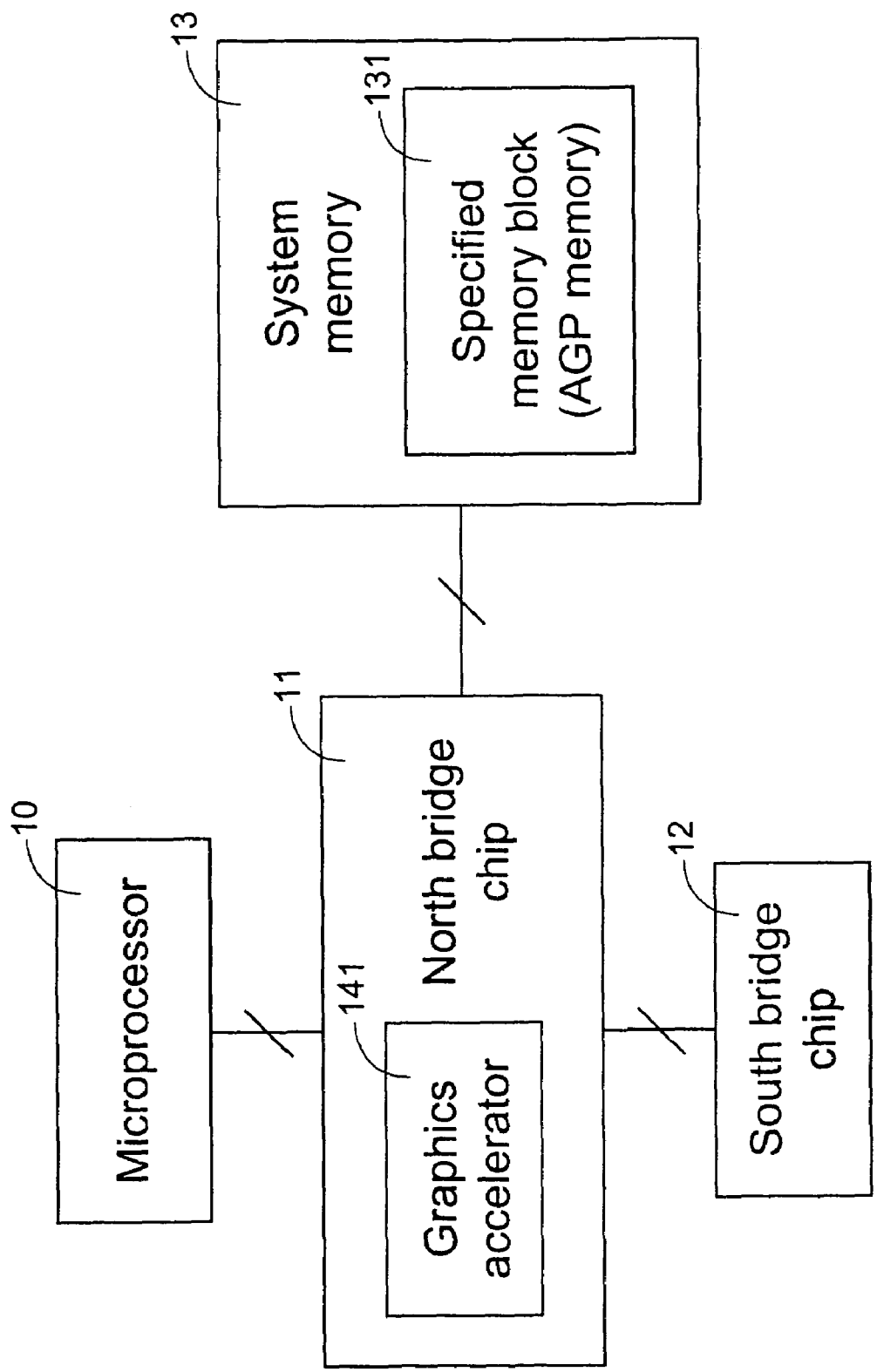
Figure 2:
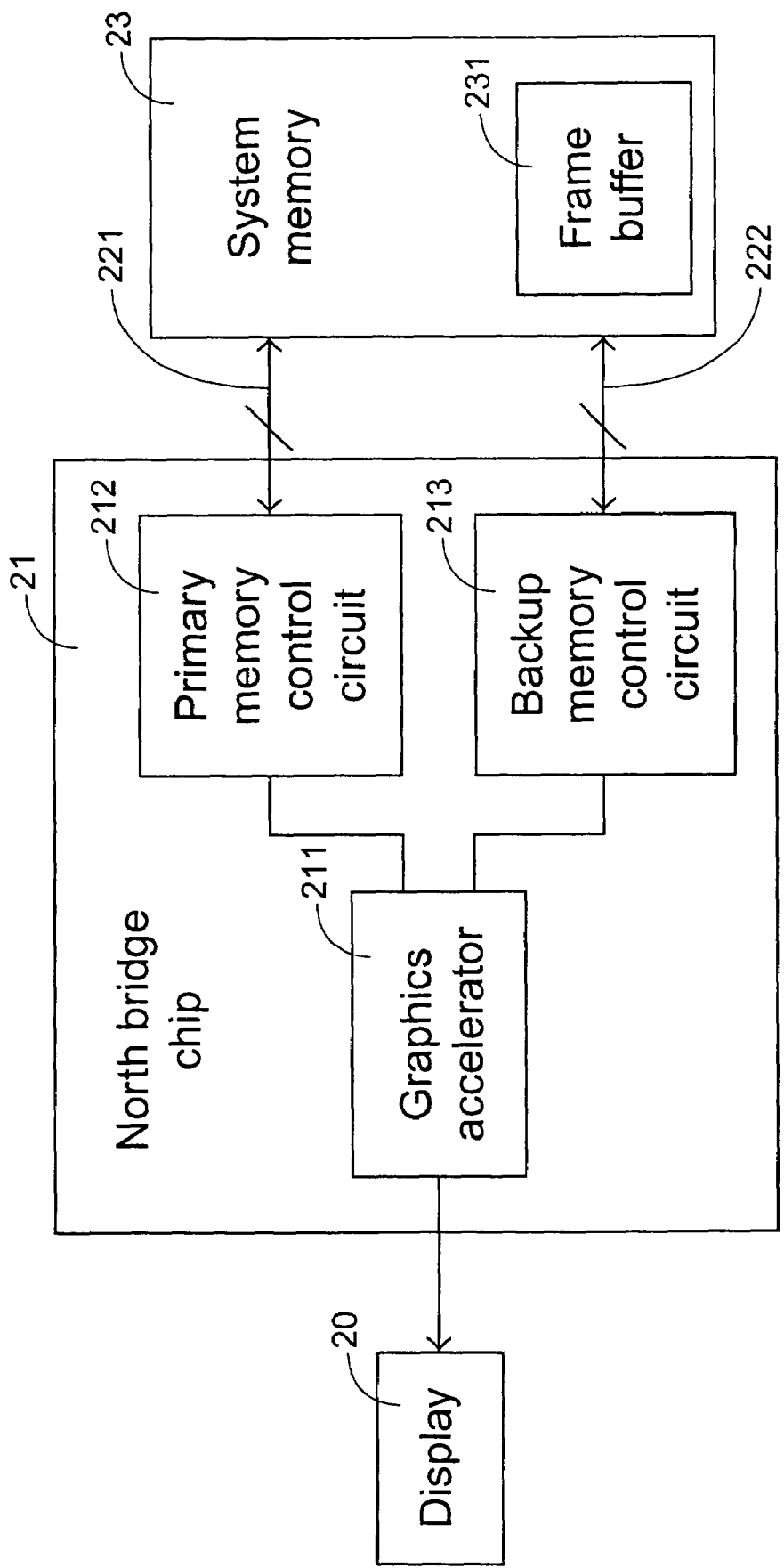
FIG. 2 is a schematic diagram illustrating an embodiment of the personal computer structure associated with graphics functions according to the present invention.

Please refer to FIG. 2. An embodiment of multi-channel data transmission by a core logic chip is illustrated. The core logic chip is a north bridge chip 21 integrated therein a graphics accelerator 211. The graphics accelerator 211 is coupled to a primary memory control circuit 212, and accesses the frame buffer 231 in the system memory 23 via a first memory bus 221. Generally, the area of the integrated core logic chip is large enough for arranging an additional memory control circuit as a backup memory control circuit 213. The backup memory control circuit 213, according to the present invention, is simultaneously used as well as the primary memory control circuit 212 for communication between the north bridge chip 21 and the system memory 23 via a second memory bus 222. In other words, the graphics accelerator 211 may access the data in the frame buffer 231 by having both the primary and the backup memory control circuits to assert respective read/write control signals to the system memory 23. Due to the increase of the data transmission channels, the data transmission bandwidth is enhanced. For example, two memory buses are used so that the bandwidth is increased from 64 bits to 128 bits. Therefore, the impact of the embedded graphics accelerator 211 on sharing the bandwidth along with the north bridge can be minimized.

In the above embodiment, the additional memory bus 222 can be similar to the existent memory bus 221 for providing extensive data transmission bandwidth. Alternatively, the additional memory bus 222 can be specific to the communication between the graphic accelerator 211 in the north bridge chip 21 and the frame buffer 231 in the system memory 23, as shown in FIG. 3.

Figure 3:
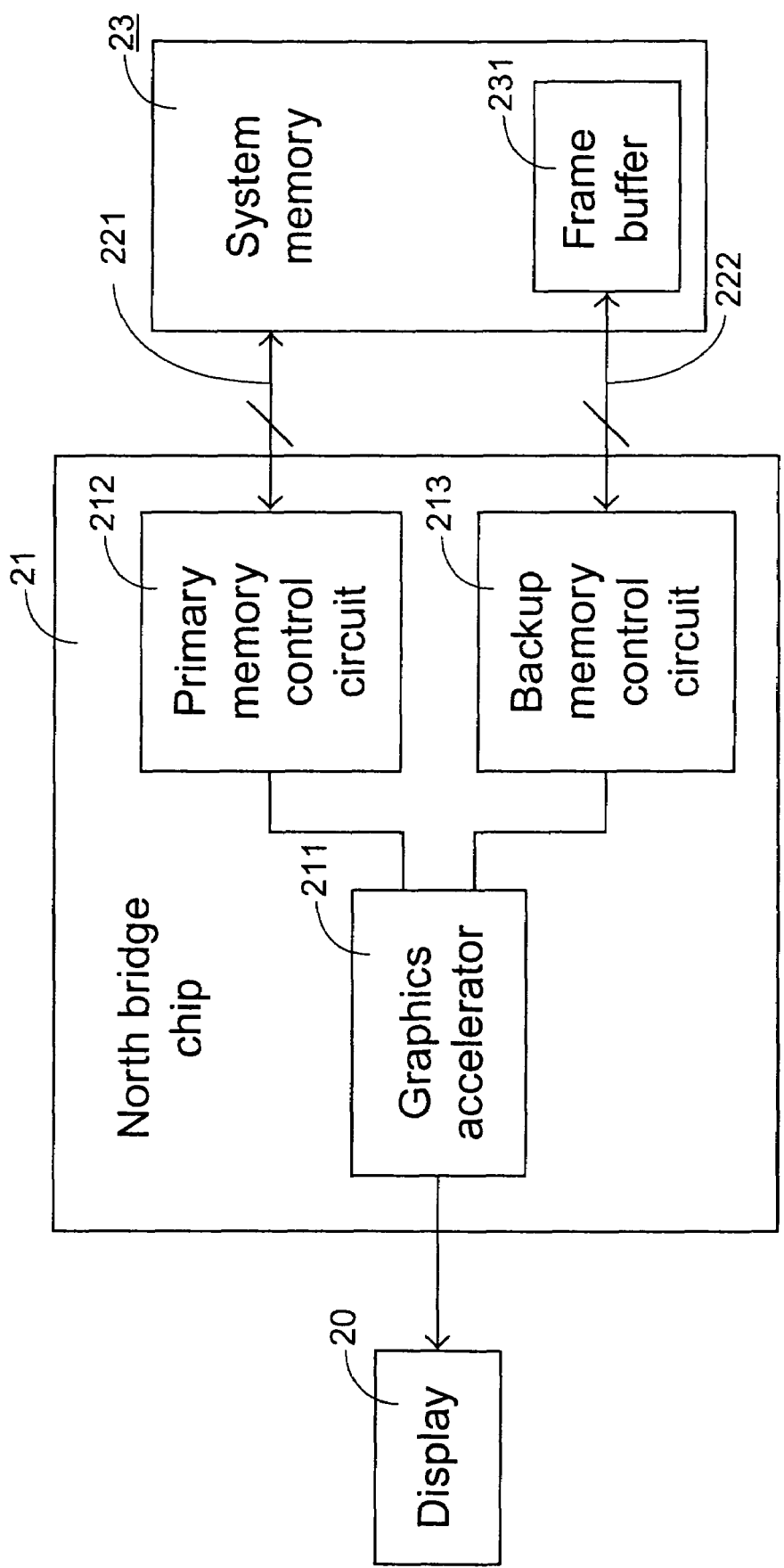
FIG. 3 is a schematic diagram illustrating another embodiment of the personal computer structure associated with graphics functions according to the present invention.

Please refer to FIG. 3. The graphics accelerator 211 is integrated into the north bridge chip 21 and coupled to both of the primary and backup memory control circuits 212 and 213. While the memory bus 221 universally communicates the north bridge chip 21 with the system memory 23, the memory bus 222 specifically communicates the graphics accelerator 211 with a specific memory block, e.g. the frame buffer 231, in the system memory 23. Since the graphics accelerator 211 has an exclusive bus, e.g. the memory bus 222, to access the frame buffer 231, the bandwidth of the primary memory bus. i.e. bus 221, can be exempted from being shared by graphics accelerator 211. Therefore, the insufficient bandwidth problem can thus be solved.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A core logic chip for use in a personal computer system comprising a system memory and a display, said core logic chip being incorporated therein:
   a graphics accelerator;
   a primary memory control circuit in communication with said graphics accelerator, controlled by said graphics accelerator to assert a first read/write signal;
   a first data transmission channel in communication with said primary memory control circuit and said system memory, transmitting said first read/write signal to said system memory;
   a backup memory control circuit in communication with said graphics accelerator, controlled by said graphics accelerator to assert a second read/write signal; and
   a second data transmission channel in communication with said backup memory control circuit and said system memory, transmitting said second read/write signal to said system memory,
   wherein each of said first and said second read/write signals is a part of a specific read/write signal for obtaining a specified image data from said system memory to be processed by said graphics accelerator, wherein said system memory includes a frame buffer where said image data is stored.

2. The core logic chip according to claim 1 wherein said system memory is a dynamic random access memory.

3. The core logic chip according to claim 1 wherein said first and second data transmission channels are separate from each other but cooperating to transmit said specific read/write signal.

4. A core logic chip for use in a personal computer system comprising a system memory and a display, said core logic chip being incorporated therein:
   a graphics accelerator;
   a primary memory control circuit coupled to said graphics accelerator and accessible to a frame buffer in said system memory at a request of said graphics accelerator;
   a backup memory control circuit coupled to said graphics accelerator and accessible to said frame buffer in said system memory at said request of said graphics accelerator;
   a first data transmission channel disposed between said primary memory control circuit and said system memory and transmitting a first portion of an image data from said frame buffer in response to a first read/write signal issued by said primary memory control circuit; and
   a second data transmission channel disposed between said backup memory control circuit and said system memory and transmitting a second portion of said image data from said frame buffer in response to a second read/write signal issued by said backup memory control circuit.

* * * * *